(12) United States Patent
Yoshizawa

(10) Patent No.: US 7,567,424 B2
(45) Date of Patent: Jul. 28, 2009

(54) ELECTRONIC COMPONENT

(75) Inventor: Toshiyuki Yoshizawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/053,300

(22) Filed: Mar. 21, 2008

(65) Prior Publication Data
US 2008/0239626 A1 Oct. 2, 2008

(30) Foreign Application Priority Data
Mar. 26, 2007 (JP) ............................ 2007-079696

(51) Int. Cl.
*H01G 4/005* (2006.01)
(52) U.S. Cl. .................. 361/303; 361/311; 361/313; 361/321.1; 361/321.2; 361/301.4; 257/528; 257/532; 257/773
(58) Field of Classification Search ................ 361/303, 361/302, 305, 311–313, 321.1, 321.2, 301.4; 257/528, 532, 773
See application file for complete search history.

(56) References Cited
U.S. PATENT DOCUMENTS 5,623,161 A * 4/1997 Fukuda et al. .............. 257/649
5,789,303 A * 8/1998 Leung et al. ................ 438/381
6,097,053 A * 8/2000 Ando ......................... 257/308
6,100,195 A * 8/2000 Chan et al. .................. 438/687
6,528,327 B2 * 3/2003 Nagano et al. ................. 438/3
6,573,584 B1 * 6/2003 Nagakari et al. ............. 257/528
6,762,107 B2 * 7/2004 Watanabe et al. ........... 438/393

FOREIGN PATENT DOCUMENTS

| JP | A 2002-25854 | 1/2002 |
| JP | A-2005-93482 | 4/2005 |
| JP | A 2005-109410 | 4/2005 |
| JP | A-2006-5293 | 1/2006 |
| JP | A-2006-54338 | 2/2006 |
| JP | A-2006-311203 | 11/2006 |

* cited by examiner

*Primary Examiner*—Nguyen T Ha
(74) *Attorney, Agent, or Firm*—Oliff & Berridge, PLC

(57) ABSTRACT

This electronic component comprises a substrate; and a capacitor part provided on the substrate, the capacitor part includes a first electrode part provided on the substrate; a dielectric film covering the first electrode part; an insulating film that contacts the dielectric film and has an opening part; and a second electrode part that contacts an inner wall surface of the opening part of the insulating film and a surface of the dielectric film, and when the angle between a first interface between the dielectric film and the insulating film, and a second interface between the insulating film and the second electrode part is θ, θ is not more than 22°.

5 Claims, 10 Drawing Sheets

ELECTRONIC COMPONENT

BACKGROUND OF THE INVENTION

1. Field of the Invention

The present invention relates to an electronic component.

2. Related Background of the Invention

With the recent progress such as miniaturization and improved functions of an electronic device, the requirement for miniaturization and improved functions of passive components such as an inductor and a capacitor that have been conventionally independently used, also, has been increasing. The technology has been developed which manufactures a small and short electronic component with high dimensional accuracy by the use of a thin film formation process such as a sputtering method, an evaporation method, a CVD method, and the fine processing technology such as photolithography, dry etching, in order to meet such a requirement.

There is an electronic component that has a thin film capacitor as one of the electronic components that are manufactured by the use of the thin film formation process and fine processing technology (for example, see the Patent document 1 (Japanese Patent Application Laid-Open No. 2002-25854) and Patent document 2 (Japanese Patent Application Laid-Open No. 2005-109410)). According to an electronic component that is disclosed in the Patent document 1 and Patent document 2, a dielectric thin film is formed on the bottom electrode of a capacitor, an insulating film that has an opening part is formed on the dielectric thin film, and a top electrode contacts the inner wail surface of the opening part and a surface of the dielectric thin film. Here, the insulating film plays a role of controlling the capacitance of the capacitor and insulating the end part of the electrode.

SUMMARY OF THE INVENTION

However, according to an electronic component disclosed in the foregoing Patent documents 1 and 2, the breakdown voltage tends to be low and therefore there is still much room for improvement in the electrical properties.

Hence, an object of the present invention is to provide an electronic component that can enhance the electrical properties.

The present inventors examined keenly the above described problems in order to solve the problems. As a result, the present inventor found that the angle between the interface between a dielectric film and an insulating film, and the interface between the top electrode part and the insulating film is related to breakdown voltage increase. The present invention was made as the result of further intensive studies.

That is, an electronic component according to the present invention comprises a substrate; and a capacitor part provided on the substrate, wherein the capacitor part includes a first electrode part provided on the substrate; a dielectric film provided on the first electrode part; an insulating film that contacts the dielectric film and has an opening part on the dielectric film; and a second electrode part that contacts the inner wall surface of the opening part of the insulating film and a surface of the dielectric film, wherein the angle θ between the first interface between the dielectric film and the insulating film, and the second interface between the insulating film and the second electrode part is not more than 22°. Here, the angle θ between the first interface and the second interface is more than 0°.

It is possible to significantly increase the breakdown voltage when voltage is applied between the first electrode part and the second electrode part, in comparison with the case where θ exceeds 22°, in the capacitor part according to the electronic component. As a result, it is possible to enhance the electrical properties.

The above described electronic component may further comprise an inductor part that is provided on the substrate and is connected to the capacitor part.

In this case, the electronic component can function as an LC circuit component. At this time, the breakdown voltage can be increased in the capacitor part according to the electronic component Thus, it is possible to increase the limiting voltage that can be applied and to enhance the versatility.

In the capacitor part of the electronic component, the angle θ between the first interface and the second interface is preferably not less than 5°. In this case, the effect on the capacitance by the insulating film is reduced, and it is possible to easily control the capacitance of the capacitor.

Here, it is not apparent why it is possible to enhance the breakdown property of the capacitor part by making θ not more than 22° as described above. However, it is inferred that the reason is because the shape of a portion of the insulating film that is determined by the angle between the first interface between the dielectric film and the insulating film, and the second interface between the insulating film and the second electrode part lowers the concentration of the electric field density of the portion of the insulating film.

According to the present invention, an electronic component that can enhance the electrical properties is provided.

DESCRIPTION OF THE PREFERRED EMBODIMENTS

First Embodiment

A first embodiment of an electronic component according to the present invention will be described referring to FIGS. 1 to 5.

Figure 1:
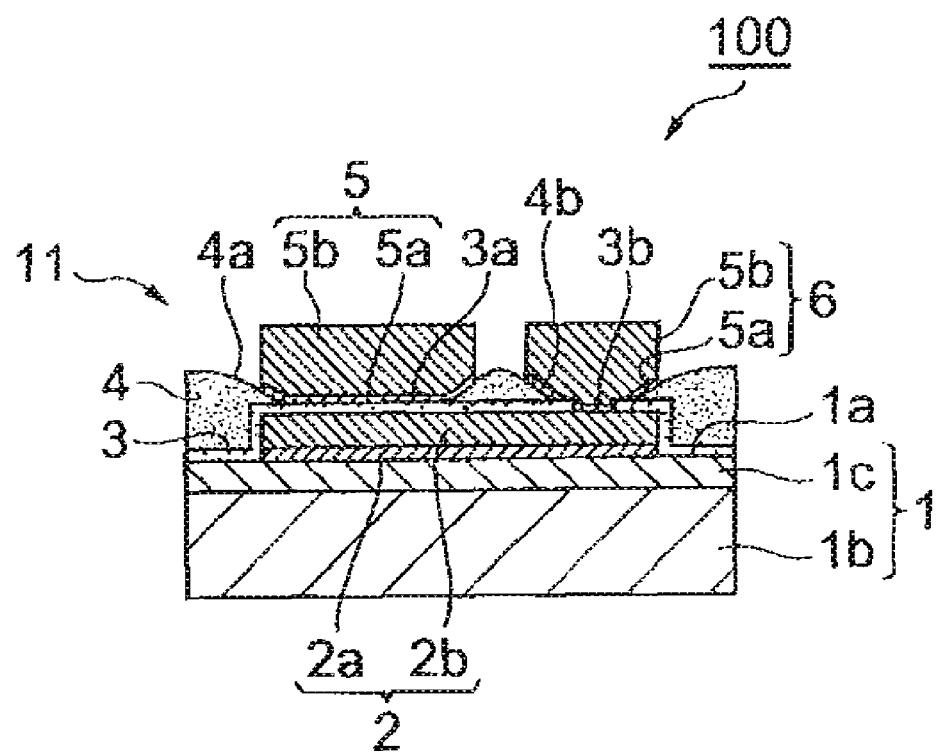
FIG. 1 is a cross sectional view showing one embodiment of an electronic component according to the present invention.

FIG. 1 is a cross sectional view showing the first embodiment of the electronic component according to the present invention. An electronic component 100 of the present embodiment includes a substrate 1 and a capacitor part 11 that is provided on a principal surface 1a side of the substrate 1, as shown in FIG. 1.

The capacitor part 11 has a bottom electrode part (first electrode part) 2 provided on the substrate 1, a dielectric film 3 that covers the bottom electrode part 2, an insulating film 4 that contacts the dielectric film 3, a top electrode part (second electrode part) 5 that contacts a surface 3a of the dielectric film 3 and is provided thereon, and an electrode pad 6 for applying voltage that contacts the bottom electrode part 2 and applies voltage to the bottom electrode part 2. Thus, it is possible to apply voltage to the dielectric film 3 between the top electrode part 5 and the bottom electrode part 2 by applying voltage between the top electrode part 5 and the electrode pad 6 for applying voltage.

The substrate 1 has a body part 1b of the substrate and a planarizing film 1c that is provided on the body part 1b of the substrate and contacts the bottom electrode part 2 and the dielectric film 3.

The bottom electrode part 2 has a seed layer 2a provided on the principal surface 1a of the substrate 1 and a plating layer 2b provided on the seed layer 2a. The top electrode part 5 also has a seed layer 5a that contacts the dielectric film 3 and a plating layer 5b provided on the seed layer 5a. The electrode pad 6 for applying voltage also has a seed layer 5a that contacts the bottom electrode part 2 and a plating layer 5b provided on the seed layer 5a.

The insulating film 4 has a first opening part 4a and a second opening part 4b that are provided separated from each other on the dielectric film 3. The insulating film 4 plays a role of controlling the capacitance of the electronic component 100 and insulating the end part of the top electrode part 5 and the end part of the bottom electrode part 2. Here, the first opening part 4a and the second opening part 4b are through holes, and expose the dielectric film 3 to the seed layers 5a.

The dielectric film 3 has a through hole 3b that exposes the bottom electrode part 2 to the seed layer 5a, at the position opposite to the second opening part 4b.

The top electrode part 5 is provided in the first opening part 4a so as to contact the inner wall surface forming the first opening part 4a of the insulating film 4 and a surface of the dielectric film 3. Also, the electrode pad 6 for applying voltage contacts the inner wall surface forming the second opening part 4b of the insulating film 4, the surface of the dielectric film 3, the inner wall surface forming the through hole 3b of the dielectric film 3, and the bottom electrode part 2.

Figure 2:
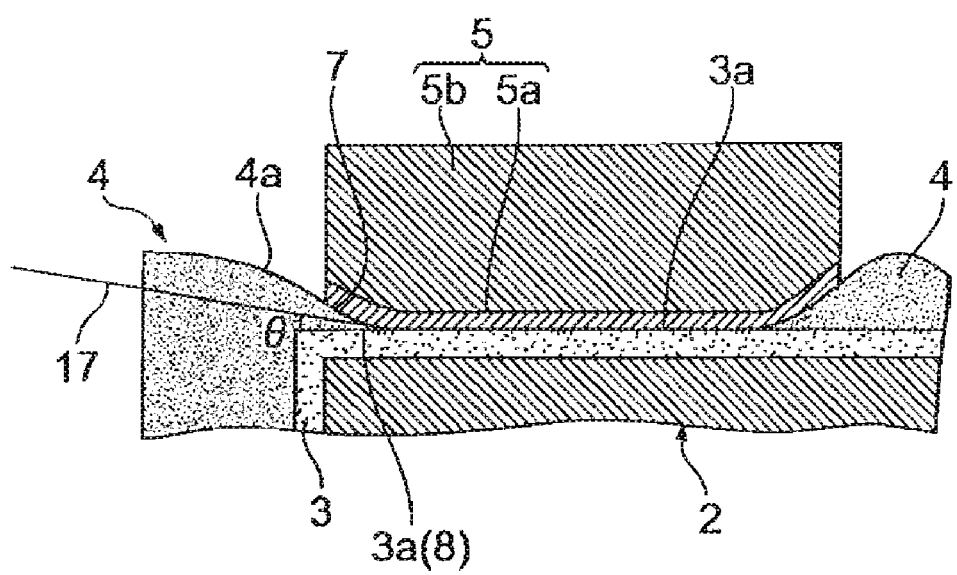
FIG. 2 is a partially enlarged sectional view of FIG. 1.

Here, as shown in FIG. 2, the electronic component 100 has an angle $\theta$ not more than 22° when the angle between a first interface 8 between the dielectric film 3 and the insulating film 4, and a second interface 7 between the insulating film 4 and the top electrode part 5 is $\theta$ (here, $\theta$ is an acute angle more than 0°). Here, the angle between the first interface 8 and the second interface 7 is the angle between a line 17 and a first boundary line when the line 17 contacts for the first time a second boundary line in the case where the line 17 is rotated, in the direction from the first boundary line to the second boundary line, which passes through a contact point of the first bound line corresponding to the first interface 8 and the second boundary line corresponding to the second interface 7 in a cross section along the thickness direction of the substrate 1 in the electronic component 100.

According to the electronic component 100, it is possible to significantly increase the breakdown voltage when voltage is applied between the bottom electrode part 2 and the top electrode part 5 by applying voltage between the top electrode part 5 and the electrode pad 6 for applying voltage, in comparison with the case where $\theta$ exceeds 2.2. As a result, it is possible to enhance the electrical properties.

It is not apparent why it is possible to thus enhance the breakdown property of the electronic component 100 by making $\theta$ not more than 22°. However, it is inferred that the reason is because the shape of a portion of the insulating film 4 that is determined by the angle between the first interface 8 between the dielectric film 3 and the insulating film 4, and the second interface 7 between the insulating film 4 and the top electrode part 5 lowers the concentration of the electric field density of the portion of the insulating film 4.

Here, $\theta$ is preferably not more than 11°. This reason is because the breakdown is more unlikely to occur in comparison with the case where $\theta$ exceeds 11°. However, although the breakdown property becomes superior if $\theta$ becomes small, since the effect on the capacitance of the insulating film portion becomes large, it becomes difficult to control the capacitance. Thus, $\theta$ is preferably not less than 5°.

The insulating material such as, but not limited to, for example, ceramics that are represented by alumina zirconia, and forsterite, and glass is used as the material composing the body part 1b of the substrate.

A pattern of concavity and convexity is formed on a surface of the body part 1b of the substrate if ceramics are used as the material composing the body part 1b of the substrate. Thus, if the pattern of concavity and convexity is transcribed on the bottom electrode part 2 formed on the body part 1b of the substrate, the problem is caused that a surface of the bottom electrode part 2 is not smooth, or a portion of the bottom electrode part 2 has a defect. Therefore, if ceramics are used as the material composing the body part 1b of the substrate, it is preferable to form a glaze glass layer, a resin layer, and the like on the body part 1b of the substrate, and to carry out a planarizing treatment such as CMP (Chemical Mechanical Polishing), or the like, in order to form the planarizing film 1c.

The conductive metal material such as, for example, Cu, Ag, Pt, Pd, Ru, and Ir can be utilized as the material composing the bottom electrode part 2, the top electrode part 5, and the electrode pad 6 for applying voltage. The material composing the bottom electrode part 2, the top electrode part 5, and the electrode pad 6 for applying voltage may be identical or different.

SiO$_2$, Al$_2$O$_3$, Si$_3$N$_4$, AlN, TiO$_2$, Ta$_2$O$_3$, ZrO$_2$, HfO$_2$, SrTiO$_3$, BST, PZT, and the like, for example are used as the dielectric material composing the dielectric film 3.

A hardened structure of photosensitive resins such as a novolak resin, a benzocyclobutene resin, an epoxy resin, and a polyimid resin is generally used as the insulating material composing the insulating film 4. That is, the insulating film is made of hardened resin of at least one selected from the photosensitive resin group.

Next, a method for manufacturing the electronic component 100 will be described referring to FIGS. 3A to 5C, FIG. 3A, FIG. 3I, FIG. 3C, FIG. 3D, FIG. 4A, FIG. 4B, FIG. 4C, FIG. 5A, FIG. 5B, and FIG. 5C are process charts showing, by using cross sectional views, a part of a series of processes for manufacturing the electronic component 100.

Figure 3A:
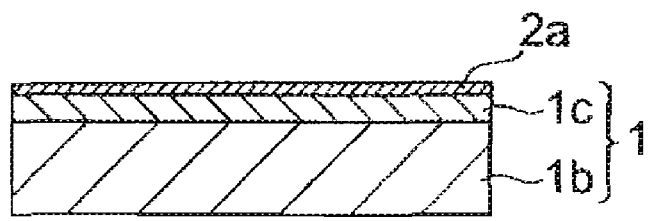
FIG. 3A is a process chart showing a part of a series of processes for manufacturing the electronic component FIG. 1, by using a cross sectional view.

First, an alumina film that is a planarizing film is formed on the body part 1b of the substrate by using, for example, a sputter method, the alumina film is planarized by using, for example, a CMP method, and then the planarizing film 1c is formed. Next, the seed layer 2a for plating is formed on the planarizing film 1c (FIG. 3A).

Figure 3B:
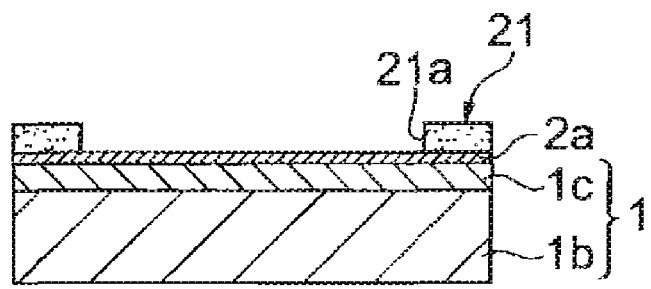
FIG. 3B is a process chart showing a part of a series of processes for manufacturing the electronic component in FIG. 1, by using a cross sectional view.
Figure 3C:
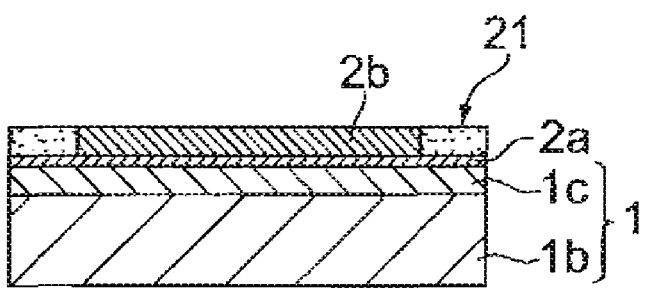
FIG. 3C is a process chart showing a part of a series of processes for manufacturing the electronic component in FIG. 1, by using a cross sectional view.
Figure 3D:
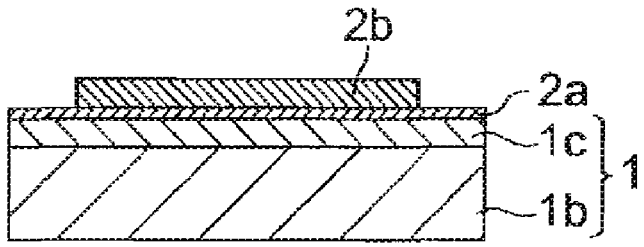
FIG. 3D is a process chart showing a part of a series of processes for manufacturing the electronic component in FIG. 1, by using a cross sectional view.
Figure 4A:
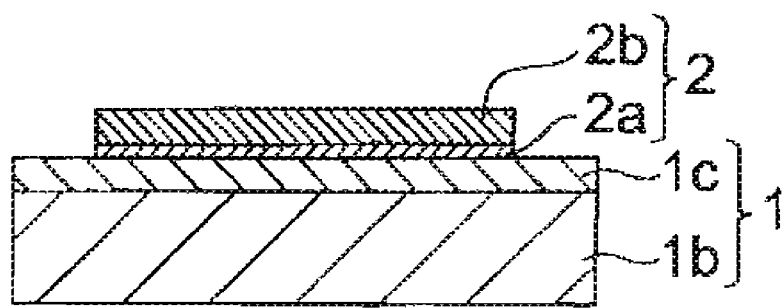
FIG. 4A is a process chart showing a part of a series of processes for manufacturing the electronic component in FIG. 1, by using a cross sectional view.

Next, a resist pattern 21 having an opening part 21a at the position where the bottom electrode part 2 should be formed is formed on the seed layer 2a (FIG. 3B). Subsequently, the plating layer 2b is formed on the seed layer 2a exposed in the opening part 21a using an electroplating method (FIG. 3C). Thereafter; the resist pattern 21 is removed (FIG. 3D), and the seed layer 2a that is exposed is removed. Thus, the bottom electrode part 2 is formed (FIG. 4A).

Figure 4B:
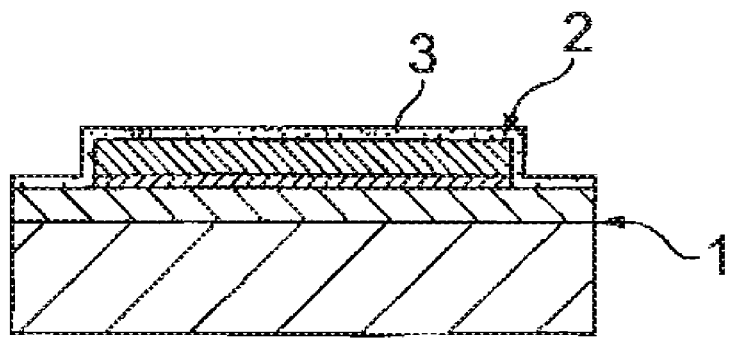
FIG. 4B is a process chart showing a part of a series of processes for manufacturing the electronic component in FIG. 1, by using a cross sectional view.

Next, the dielectric film 3 is formed so as to cover the bottom electrode part 2 and the exposed portion of the principal surface 1a of the substrate 1 (FIG. 4B). The dielectric film 3 is made by forming a film of dielectric material using a film formation process such as a vapor deposition process, a sputtering process, a plasma CVD) process, an ALD process, or the like.

Figure 4C:
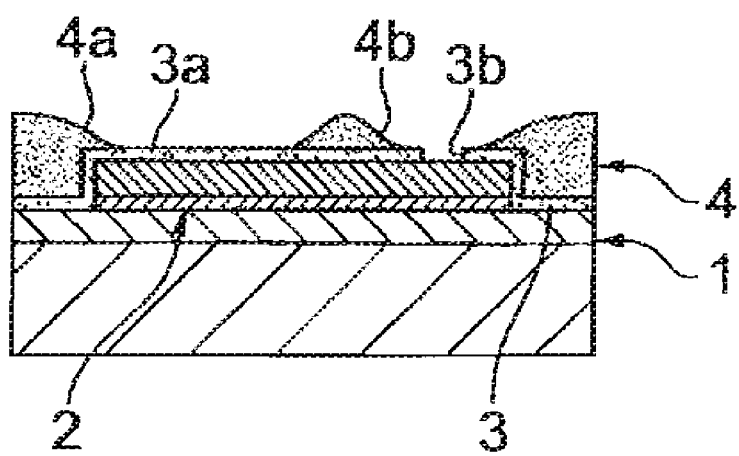
FIG. 4C is a process chart showing a part of a series of processes for manufacturing the electronic component in FIG. 1, by using a cross sectional view.

Next, the insulating film 4 having the first opening part 4a and the second opening part 4b is formed on a surface 3a of the dielectric film 3 (FIG. 4C). The insulating film 4 is made, for example, by forming a photosensitive resin layer on the dielectric film 3 using a spin coat method, by carrying out the process of patterning the photosensitive resin layer by the exposure and development of a pattern, and by carrying out the process of heat hardening of the patterned photosensitive resin layer. The insulating film 4 with superior heat resistance can be obtained by heating the photosensitive resin layer. The insulating film 4 that is patterned at high fineness and high accuracy car be manufactured at a low cost by the use of a photosensitive resin layer. Pattern exposure is performed to form the opening part 4a and the second opening part 4b in the photosensitive resin layer by the development of the pattern.

At this time, the angle $\theta$ between the first interface 8 and the inner wall surface of the first opening part 4a of the insulating film 4 is adjusted to be not more than 22°. Here, the inner wall surface of the first opening part 4a of the insulating film 4 is the second interface between the top electrode part 5 and the insulating film 4. Also, the size of $\theta$ can be adjusted by adjusting any of, for example, the viscosity, heat-hardening temperature, exposure condition, and development condition of the insulating resin material. Specifically, if the viscosity of the insulating resin material is reduced, $\theta$ tends to be small. Also, if the heat-hardening temperature is increased, $\theta$ tends to be small. For example, when a polyimid resin is used as an insulating resin material, the viscosity should be not more than 3000 centipoises (cP) and the heat-hardening temperature should be not less than 250° C. Here, 3000 cP=30 P=3 Pa·s.

Next, a resist pattern (not shown) having an opening part at the portion corresponding to the through hole 3b is formed on the insulating film 4. Then, the through hole 3b is formed in the dielectric film 3 by a dry etching process or an ion milling process. Thereafter, the resist pattern is removed (FIG. 4C).

Figure 5A:
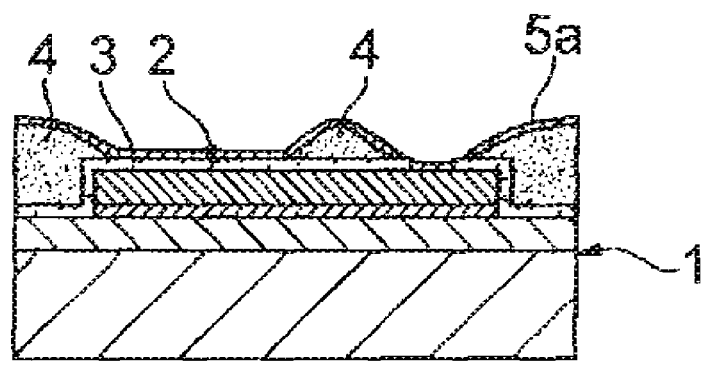
FIG. 5A is a process chart showing a part of a series of processes for manufacturing the electronic component in FIG. 1, by using a cross sectional view.

Next, the seed layer 5a is formed so as to cover a surface of the insulating film 4, the inner wall surface of the first opening part 4a of the insulating film 4, the inner wall surface of the second opening part 4b, the inner wall surface of the through hole 3b formed in the dielectric film 3, and the surface of the bottom electrode part 2 which is exposed (FIG. 5A). Thereafter, the resist pattern (not shown) having each opening part at each of the positions where the plating layer 5b of the top electrode part 5 and the plating layer 5b of the electrode pad 6 for applying voltage should be formed is formed on the seed layer 5a. At this time, the opening part at the positions where the plating layer 5b of the top electrode part 5 should be formed is formed so as to expose a portion of the surface of the dielectric film 3 and a portion of the inner wall surface of the insulating film 4.

Figure 5B:
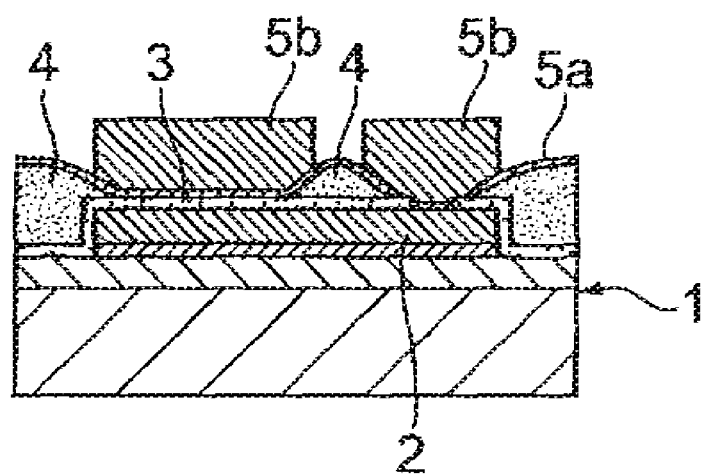
FIG. 5B is a process chart showing a part of a series of processes for manufacturing the electronic component in FIG. 1, by using a cross sectional view.
Figure 5C:
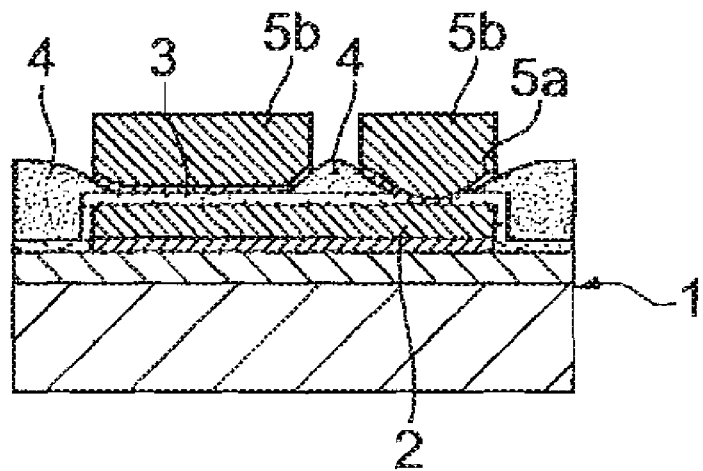
FIG. 5C is a process chart showing a part of a series of processes for manufacturing the electronic component in FIG. 1, by using a cross sectional view.

Next, the plating layers 5b are formed on the seed layer 5a that is on the first opening part 4a and second opening part 4b of the insulating film 4 and is exposed, by using an electroplating method Subsequently, the resist pattern is removed (FIG. 5B). Thereafter, the seed layer 5a that is exposed at this time is removed. Thus, the top electrode part 5 is obtained. In addition, at the same time, the electrode pad 6 for applying voltage is obtained to contact the bottom electrode part 2 (FIG. 5C). The manufacture of the electronic component 100 is finished as above described.

Second Embodiment

Next, second embodiment of an electronic component according to the present invention will be describe Here, the component elements identical or equivalent to the component elements of first embodiment are identified by the same reference numerals, and the duplicate description will be omitted.

Figure 6:
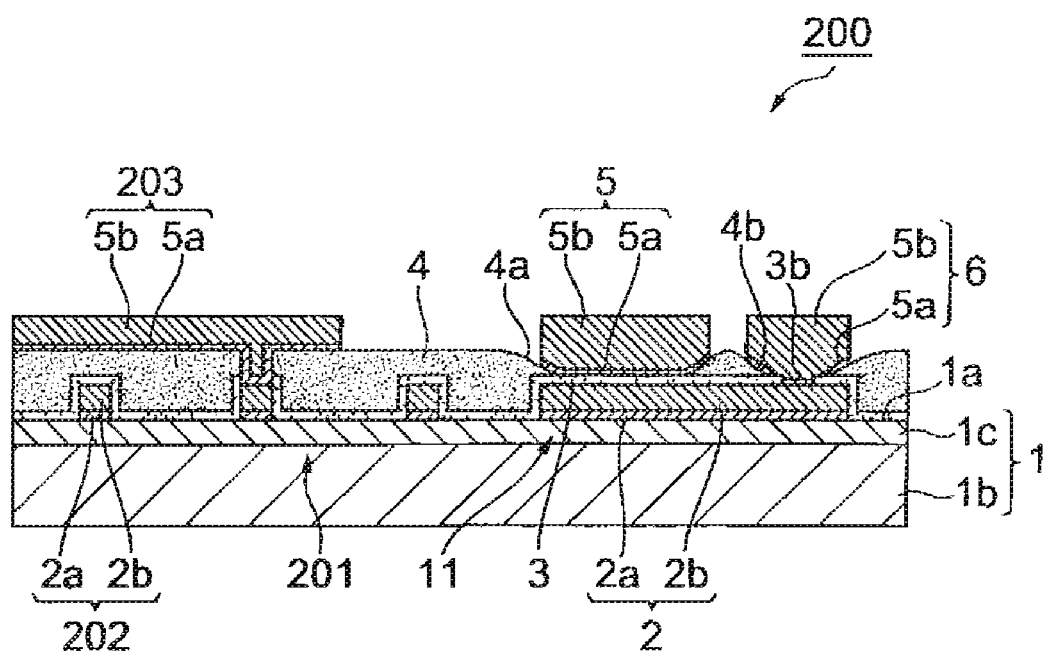
FIG. 6 is a cross sectional view showing another embodiment of an electronic component according to the present invention.

An electronic component 200 as shown in FIG. 6 is different from the electronic component 100 in terms of further having an inductor part 201 connected electrically to a capacitor part 11, on the principal surface 1a of a substrate 1. Thus, the electronic component 200 can function as an LC filter (LC circuit component). At this time, according to the electronic component 200, the breakdown voltage of the capacitor part 11 can be increased. Thus, it is possible to increase the limiting voltage that can be applied and to enhance the versatility.

The inductor part 201 will be described in detail. The electronic component 200 as shown in FIG. 6 has a spiral coil part 202, a dielectric film 3 covering the coil part 202, an insulating film 4 provided on the dielectric film 3, and a lead-out conductor part 203 that is provided on the insulating film 4 and is connected electrically to the coil part 202, on or above the principal surface 1a of the substrate 1. The coil part 202 has a seed layer 2a that contacts the principal surface 1a of the substrate 1 and is provided thereon, and a plating layer 2b provided on the seed layer 2a. The lead-out conductor part 203 has a seed layer 5a that contacts the plating layer 2b of the coil part 202, and a plating layer 5b provided on the seed layer 5a. An electrode pad 6 or a top electrode part 5 of the capacitor part 11 is, via the lead-out conductor part 203, connected electrically to one end of the coil part 202 of a planar coil.

Next, a method for manufacturing the electronic component 200 will be described referring to FIG. 7A to FIG. 10.

FIG. 7A, FIG. 7B, FIG. 7C, FIG. 8A, FIG. 8B, FIG. 8C, FIG. 9A, FIG. 9B, and FIG. 10 are process charts showing one example of the method for manufacturing the electronic component 200, by the use of end views.

Figure 7A:
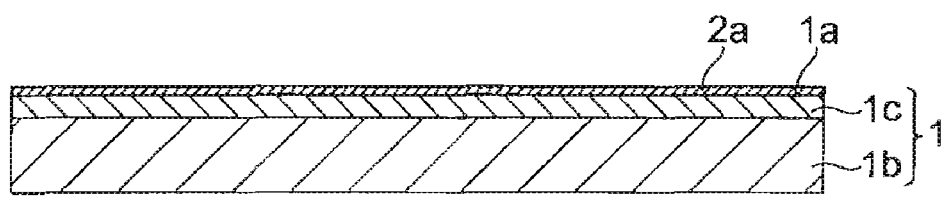
FIG. 7A is a process chart showing a part of a series of processes for manufacturing the electronic component in FIG. 6, by using a cross sectional view.

First, the seed layer 2a is formed on the principal surface 1a of the substrate 1 (FIG. 7A). The substrate 1 is prepared by forming a film on a body part 1b of the substrate by a sputtering method or the like, and by planarizing the film by a polishing process, in order to obtain a planarizing film 1c. The polishing process is carried out by a method such as a CMP.

Figure 7B:
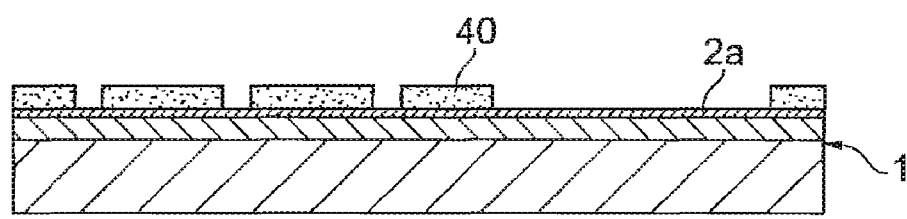
FIG. 7B is a process chart showing a part of a series of processes for manufacturing the electronic component in FIG. 6, by using a cross sectional view.
Figure 7C:
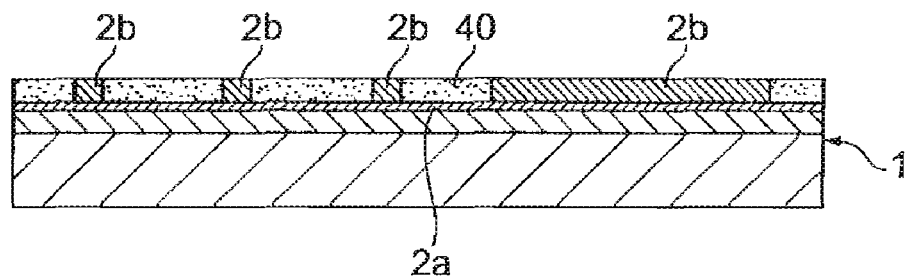
FIG. 7C is a process chart showing a part of a series of processes for manufacturing the electronic component in FIG. 6, by using a cross sectional view.

The seed layer 2a has a structure in which a titanium layer with a thickness of approximately 30 nm and a Cu layer with a thickness of approximately 100 nm are laminated, and each of the layers is formed in sequence on the planarizing film 1c by a sputtering method. Subsequently, a resist pattern 40 is formed on the seed layer 2a by the use of a photosensitive resin (FIG. 7B). Also, the plating layer 2b is formed by an electroplating process using the resist pattern 40 as a mask (FIG. 7C).

Figure 8A:
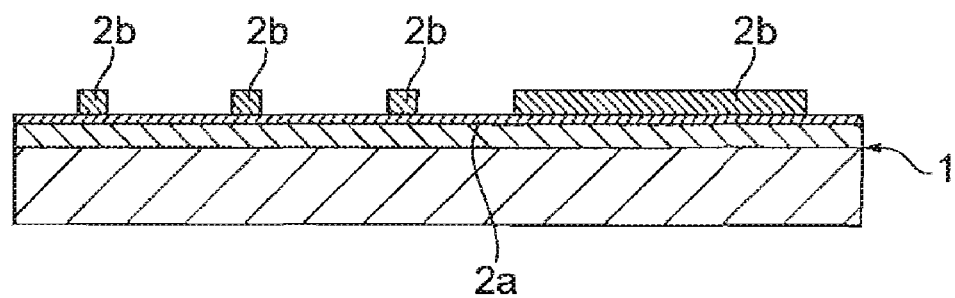
FIG. 8A is a process chart showing a part of a series of processes for manufacturing the electronic component in FIG. 6, by using a cross sectional view.
Figure 8B:
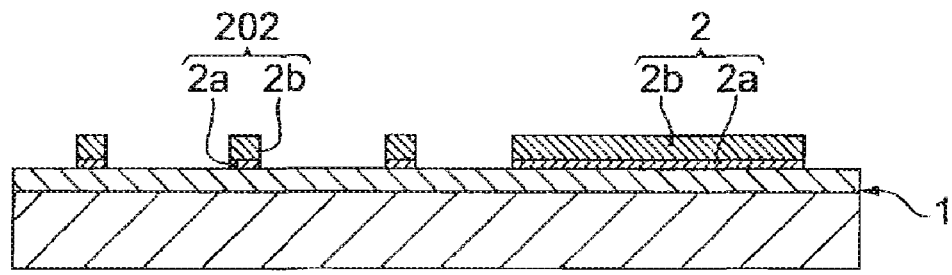
FIG. 8B is a process chart showing a part of a series of processes for manufacturing the electronic component in FIG. 6, by using a cross sectional view.
Figure 8C:
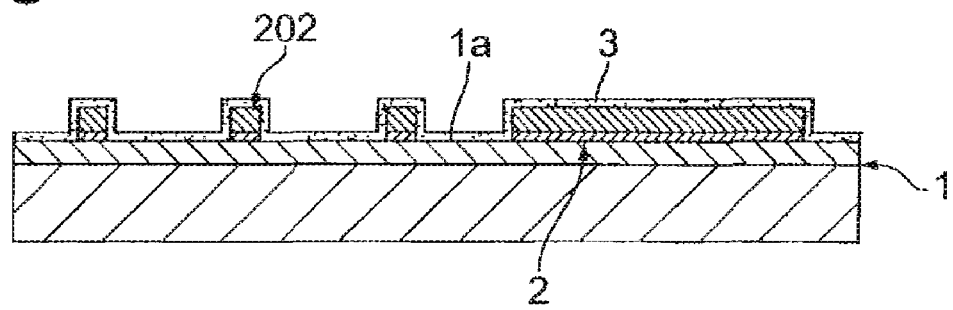
FIG. 8C is a process chart showing a part of a series of processes for manufacturing the electronic component in FIG. 6, by using a cross sectional view.

After the plating layer 2b is formed, the resist pattern 40 is removed (FIG. 8A). Thereafter, a portion of the seed layer 2a which is not covered by the plating layer 2b is removed by an ion milling process or a wet etching process, and then a bottom conductor layer that has the coil part 202 and a bottom electrode part 2 is formed (FIG. 8B). Subsequently, the dielectric film 3 is formed integrally so as to cover entire surface which is the surface of the bottom conductor layer and does not contact the substrate 1, and to cover the principal surface 1a of the substrate 1 (FIG. 8C). The dielectric film 3 is formed by, for example, a sputtering method.

Figure 9A:
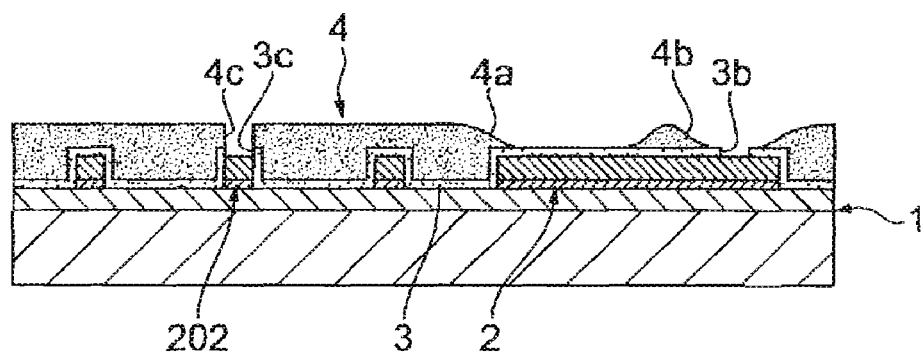
FIG. 9A is a process chart showing a part of a series of processes for manufacturing the electronic component in FIG. 6, by using a cross sectional view.
Figure 9B:
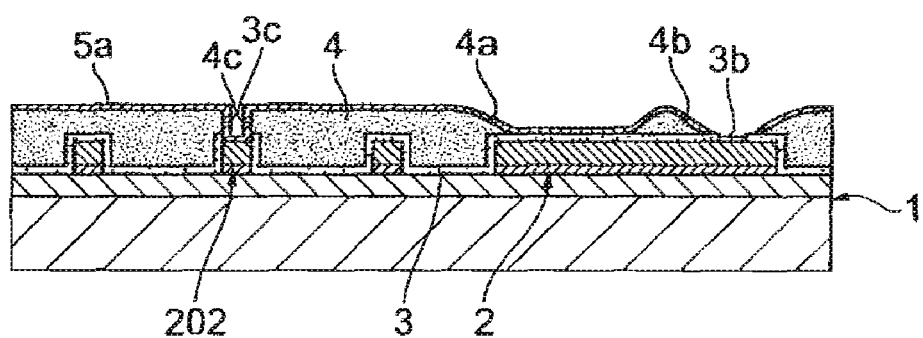
FIG. 9B is a process chart showing a part of a series of processes for manufacturing the electronic component in FIG. 6, by using a cross sectional view.

Subsequently, on the dielectric film 3, the insulating film 4 is formed which is patterned to form, at the position where the top electrode par 5 is formed, a first opening part 4a which has a surface of the dielectric film 3 as the bottom end, to form a second opening part 4b, at the position where the electrode pad 6 for applying voltage is formed; and to form a third opening part 4c, at the position where the connection part of the lead-out conductor part 203 and the coil part 202 is formed (FIG. 9A). The insulating film 4 is made, for example, by forming a photosensitive resin layer on the dielectric film 3, by carrying out the process of patterning the photosensitive resin layer by the exposure and development of a pattern, and by carrying out the process of heating the patterned photosensitive resin layer. The insulating film 4 with superior heat resistance can be obtained by heating the photosensitive resin layer. The insulating film 4 that is patterned at high fineness and high accuracy can be manufactured at a low oust by the use of a photosensitive resin.

At this time, θ is not more than 22° when the angle between a first interface between the dielectric film 3 and the insulating film 4, and the inner wall surface of the first opening part 4a of the insulating film 4 is θ. Here, θ is an acute angle more than 0°. The angle between the first interface and the inner wall surface of the first opening part 4a of the insulating film 4 can be adjusted in a manner similar to first embodiment.

After the insulating film 4 is formed, a resist pattern (not shown) having a pattern forming an opening part that communicates with the third opening part 4c, and an opening part that communicates with the second opening part 4b is formed, by the use of a photosensitive resin. Next, a portion of the dielectric film 3 is removed by an etching process using this resist pattern as a mask, and then a through hole 3b and a through hole 3c are formed. Thereafter, the resist pattern is removed. Thus, the bottom electrode part 2 is exposed at the position where the through hole 3b is formed. Also, the coil part 202 is exposed at the position where the through hole 3c is formed (FIG. 9A).

Figure 10:
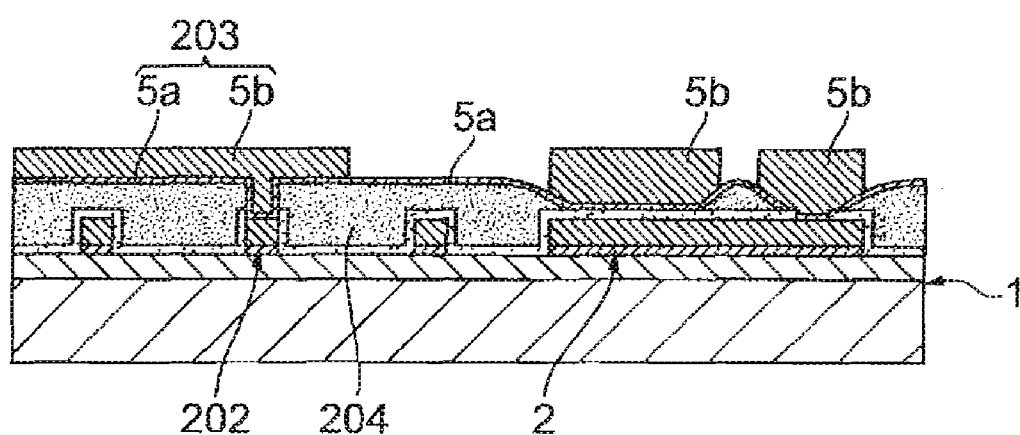
FIG. 10 is a process chart showing a part of a series of processes for manufacturing the electronic component in FIG. 6, by using a cross sectional view.

Then, a top conductor layer is formed on the insulating film 4 side surface of a laminated structure that includes the substrate 1, the bottom conductor layer, the dielectric film 3, and the insulating film 4. The seed layer 5a is formed by a sputtering method (FIG. 9B), and then a resist pattern (not shown) is formed so as to cover the portion in which plating layers 5b are not formed. Thereafter, the plating layers 5b are formed by an electroplating method on the exposed seed layer 5a, and the resist pattern is removed. As a result, the top conductor layer is formed (FIG. 10). Thereafter a portion of the seed layer 5a which is not covered by the plating layers 5b is removed, and then the electronic component 200 is obtained.

The present invention is not limited to the above described embodiments. For example, according to the above described second embodiment, the inductor part has a spiral coil part However, the inductor part may be a solenoid coil part. That is, the inductor part may have a coil part provided so as to surround the dielectric film 3.

Also, according to the above described first and second embodiments, although conductor parts such as the top electrode part 5, the bottom electrode part 2, and the coil part are formed by an electroplating method, these conductor parts may be formed as below. That is, after a film of conductive material is formed using a film formation process such as an evaporating process, a sputtering process, or a CVD process, a resist pattern is formed so as to overlap a position on which the conductive parts should be formed. Then, the exposed conductive material is removed by a process such as a dry etching process like an RIE process, an ion milling process, or a wet etching process. Subsequently; the resist pattern is removed, and the conductive parts are formed.

Although the present invention will be described more specifically below with following examples and comparative examples, the present invention is not limited to the following examples.

EXAMPLE 1

After a Ti film and a Cu film was formed to form a seed layer by a sputtering method on an alumina substrate subjected to a planarizing treatment, a resist pattern for forming a bottom electrode part was formed by a photolithography method. Thereafter, a plating layer including Cu was formed on the seed layer by an electroplating method. Then, after the resist pattern was removed, the exposed unnecessary seed layer was removed by an ion milling. Thus, a bottom electrode part was formed.

Next, an alumina film with a film thickness of 100 nm as a dielectric film was formed so as to cover the bottom electrode part and the exposed portion of the principal surface of the substrate by a sputtering method. Thereafter, a photosensitive polyimid resin (with a viscosity of 2000 centipoises) as a material for forming an insulating film was applied by a spin coat method. Then, by a photolithography method, a resist pattern having an opening part for forming a top electrode part and an opening part for forming an electrode pad was formed, the resist pattern was heated and hardened at a temperature of 300° C., and the insulating film was formed.

Subsequently, a resist pattern having an opening part for forming an electrode pad for applying voltage was formed, and then the through hole in the dielectric film so as to expose the bottom electrode part was formed by a dry etching process. Thereafter, the resist pattern was removed.

Next, a Ti film and a Cu film were formed in sequence to form a seed layer, and then a resist pattern having the opening parts for forming the top electrode part and the electrode pad for applying voltage was formed. Thereafter, plating layers including Cu were formed on the seed layer by an electroplating method. Then, the resist pattern was removed and subsequently the exposed unnecessary seed layer was removed by an ion milling. Thus, the top electrode part and the electrode pad for applying voltage were formed. In this manner, the capacitor part was obtained on the principal surface of the substrate 1.

The cross section of an electronic component thus obtained was observed using SEM, the angle θ was measured between a first interface between the dielectric film and the insulating film and a second interface between the insulating film and the top electrode part. Table 1 shows the result.

EXAMPLE 2

An electronic component was obtained in a manner similar to Example 1 except for using a heat-hardening temperature of 270° C.

In an electronic component thus obtained, in a manner similar to Example 1, the angle θ was measured between the first interlace between the dielectric film and the insulating film, and the second interface between the insulating film and the top electrode part. Table 1 shows the result.

EXAMPLE 3

An electronic component was obtained in a manner similar to Example 1 except for using a heat-hardening temperature of 250° C.

In an electronic component thus obtained, in a manner similar to Example 1 the angle θ was measured between the first interface between the dielectric film and the insulating film, and the second interlace between the insulating film and the top electrode part. Table 1 shows the result.

COMPARATIVE EXAMPLE 1

An electronic component was obtained in a manner similar to Example 1 except for using a heat-hardening temperature of 230° C. In an electronic component thus obtained, in a manner similar to Example 1, the angle θ was measured between the first interface between the dielectric film and the insulating film, and the second interface between the insulating film and the top electrode part. Table 1 shows the result.

COMPARATIVE EXAMPLE 2

An electronic component was obtained in a manner similar to Example 1 except for using a novolak resin as a material for forming the insulating film and a heat-hardening temperature of 240° C. In an electronic component thus obtained, in a manner similar to Example 1, the angle θ was measured between the first interface between the dielectric film and the insulating film, and the second interface between the insulating film and the top electrode part. Table 1 shows the result.

Comparative Example 3

An electronic component was obtained in a manner similar to Example 1 except for using an epoxy resin as a material for forming the insulating film and a heat-hardening temperature of 240° C. In an electronic component thus obtained, in a manner similar to Example 1, the angle θ was measured between the first interface between the dielectric film and the insulating film, and the second interface between the insulating film and the top electrode part. Table 1 shows the result.

(Breakdown Test)

A breakdown test was performed using the electronic components according to Examples 1 to 3 and Comparative Examples 1 to 3 that were obtained as described above, and a breakdown voltage was measured. At this time, the breakdown test was performed by applying DC voltage between the top electrode part and the electrode pad for applying voltage in the electronic component to apply the DC voltage between the top electrode part and the bottom electrode part, by boosting the DC voltage in steps of 1 V, sec.

TABLE 1

|  | Example 1 | Example 2 | Example 3 | Comparative Example 1 | Comparative Example 2 | Comparative Example 3 |
| --- | --- | --- | --- | --- | --- | --- |
| Material for forming insulating film | Polyimide resin | Polyimide resin | Polyimide resin | Polyimide resin | Novolak resin | Epoxy resin |
| Heat-hardening temperature (° C.) | 300 | 270 | 250 | 230 | 240 | 240 |
| θ (°) | 5.7 | 11.3 | 21.8 | 26.2 | 31 | 38.7 |
| Dielectric breakdown voltage (V) | 76 | 75 | 73 | 64 | 54 | 56 |

It was confirmed that it is possible to significantly increase the breakdown voltage and enhance the electrical properties in comparison with the case where θ exceeds 22°, when θ is not more than 22° as shown in Table 1.

Therefore, according to an electronic component of the present invention, it was confirmed that it is possible to increase the breakdown voltage and enhance the electrical properties.

What is claimed is:

1. An electronic component comprising:
   a substrate; and
   a capacitor part provided on said substrate, wherein said capacitor part has:
   a first electrode part provided on said substrate;
   a dielectric film provided on said first electrode part;
   an insulating film that contacts said dielectric film and has an opening part on said dielectric film; and
   a second electrode part that contacts an inner wall surface of said opening part of said insulating film and a surface of said dielectric film, and
   wherein an angle θ between a first interface between said dielectric film and said insulating film, and a second interface between said insulating film and said second electrode part is not more than 22°.

2. The electronic component according to claim 1, further comprising an inductor part that is provided on the substrate and is connected to said capacitor part.

3. The electronic component according to claim 1, wherein the angle θ between said first interface and said second interface is not less than 5°.

4. The electronic component according to claim 1, further comprising an inductor part on said substrate,
   wherein said inductor part is connected electrically to said capacitor part.

5. The electronic component according to claim 1, wherein said insulating film includes a resin obtained by hardening at least one selected from a photosensitive resin group consisting of a novolak resin, a benzocyclobutene resin, an epoxy resin, and a polyimid resin.

* * * * *